US010404262B2

(12) United States Patent
Zerbe et al.

(10) Patent No.: US 10,404,262 B2
(45) Date of Patent: Sep. 3, 2019

(54) INTEGRATED CIRCUIT HAVING A MULTIPLYING INJECTION-LOCKED OSCILLATOR

(71) Applicant: Rambus Inc., Sunnyvale, CA (US)

(72) Inventors: Jared L. Zerbe, Woodside, CA (US); Barry W. Daly, Chapel Hill, NC (US); Dustin T. Dunwell, Toronto Ontario (CA); Anthony C. Carusone, Burlington Ontario (CA); John C. Eble, III, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 264 days.

(21) Appl. No.: 15/390,362

(22) Filed: Dec. 23, 2016

(65) Prior Publication Data

US 2017/0207791 A1    Jul. 20, 2017

Related U.S. Application Data

(63) Continuation of application No. 14/858,830, filed on Sep. 18, 2015, now Pat. No. 9,564,911, which is a
(Continued)

(51) Int. Cl.
*H03L 7/24* (2006.01)
*H03K 3/03* (2006.01)
(Continued)

(52) U.S. Cl.
CPC ............... *H03L 7/24* (2013.01); *H03B 27/00* (2013.01); *H03K 3/0315* (2013.01);
(Continued)

(58) Field of Classification Search
CPC .... H03K 5/133; H03K 3/0322; H03K 3/0315; H03L 7/24; H03B 27/00
(Continued)

(56) References Cited

U.S. PATENT DOCUMENTS 5,546,056 A    8/1996  Tokumitsu
6,617,936 B2   9/2003  Daily et al.
(Continued)

OTHER PUBLICATIONS

Adler, Robert, "A Study of Locking Phenomena in Oscillators," Jun. 1946, Proceedings of the I.R.E. and Waves and Electrons, p. 351-357. 7 pages.
(Continued)

*Primary Examiner* — Arnold M Kinkead
(74) *Attorney, Agent, or Firm* — Park, Vaughan, Fleming & Dowler LLP; Laxman Sahasrabuddhe

(57) ABSTRACT

Methods and apparatuses featuring a multiplying injection-locked oscillator are described. Some embodiments include a pulse-generator-and-injector and one or more injection-locked oscillators. The outputs of the pulse-generator-and-injector can be injected into corresponding injection points of an injection-locked oscillator. In embodiments that include multiple injection-locked oscillators, the outputs of each injection-locked oscillator can be injected into the corresponding injection points of the next injection-locked oscillator. Some embodiments reduce deterministic jitter by dynamically modifying the loop length of an injection-locked oscillator, and/or by using a duty cycle corrector, and/or by multiplexing/blending the outputs from multiple delay elements of an injection-locked oscillator.

20 Claims, 12 Drawing Sheets

Related U.S. Application Data continuation of application No. 14/000,710, filed as application No. PCT/US2012/034074 on Apr. 18, 2012, now Pat. No. 9,154,145.

(60) Provisional application No. 61/481,625, filed on May 2, 2011.

(51) Int. Cl.
  *H03B 27/00* (2006.01)
  *H03K 5/133* (2014.01)
  *H03K 5/156* (2006.01)

(52) U.S. Cl.
  CPC ........... *H03K 3/0322* (2013.01); *H03K 5/133* (2013.01); *H03K 5/1565* (2013.01)

(58) Field of Classification Search
  USPC ................ 327/299, 158, 105, 116, 119, 271; 331/57, 46
  See application file for complete search history.

(56) References Cited

U.S. PATENT DOCUMENTS

| | | | |
|---|---|---|---|
| 7,710,210 B2 | 5/2010 | Casper et al. | |
| 7,855,933 B2 | 12/2010 | Song | |
| 8,018,261 B2 | 9/2011 | Becker et al. | |
| 8,811,926 B2 | 8/2014 | Otis et al. | |
| 9,154,145 B2 * | 10/2015 | Zerbe | H03K 3/0322 |
| 9,564,911 B2 * | 2/2017 | Zerbe | H03K 3/0322 |
| 2006/0250170 A1 | 11/2006 | Wang | |
| 2009/0086871 A1 | 4/2009 | Casper et al. | |
| 2009/0167441 A1 | 7/2009 | Song et al. | |
| 2009/0175116 A1 | 7/2009 | Song et al. | |
| 2009/0322389 A1 | 12/2009 | Singh et al. | |
| 2014/0035650 A1 | 2/2014 | Zerbe et al. | |

OTHER PUBLICATIONS

Carusone, Tony Chan, "Injection-Locking for High-Speed Wireline Communication," University of Toronto, Apr. 15, 2010. 14 pages.
Casper et al., "A 20Gb/s Forwarded Clock Transceiver in 90nm CMOS," 4.6, ISSCC 2006 Session 4. 10 pages.
Farjad-Rad, Ramin et al., "A 33-mW 8-Gb/s CMOS Clock Multiplier and CDR for Highly Integrated I/Os," IEEE Journal of Solid-State Circuits, vol. 39, No. 9, Sep. 2004, pp. 1553-1561. 9 pages.
Hossain, et al., "5-10 Gb/s 70 mW Burst Mode AC Coupled Receiver in 90-nm CMOS," IEEE Journal of Solid-State Circuits, vol. 45, No. 3, Mar. 2010, p. 524-537. 14 pages.
Hossain, M. et al.,"A 6.8mW 7.4Gb/s clock-forwarded receiver with up to 300MHz jitter tracking in 65nm CMOS," 2010 IEEE International Solid-State Circuits Conference Digest of Technical Papers (ISSCC), pp. 158-159, Feb. 7-11, 2010. 3 pages.
Hossain, Masum et al., "CMOS Oscillators for Clock Distribution and Injection-Locked Deskew," IEEE Journal of Solid-State Circuits, vol. 44, No. 8, pp. 2138-2153, Aug. 2009. 16 pages.
Hu, Kangmin et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010. 10 pages.
International Search Report and Written Opinion dated Nov. 23, 2012 in International Application No. PCT/US2012/034074. 11 pages.
Jaussi et al., "A 20Gb/s Embedded Clock Transceiver in 90nm CMOS." 18.8, ISSCC 2006 Session 18. 10 pages.
Lai et al., "Capturing Oscillator Injection Locking via Nonlinear Phase-Domain Macromodels," IEEE Transactions on Microwave Theory and Techniques, vol. 52, No. 9, Sep. 2004, p. 2251-2261. 11 pages.
Lee, Jri et al., "Paper 5.2: Subharmonically Injection-Locked PLLs for Ultra-Low-Noise Clock Generation," Slides, 2009 IEEE International Solid-State Circuits Conference. 32 pages.
Lee, Jri et al., "Subharmonically Injection-Locked PLLs for Ultra-Low-Noise Clock Generation," ISSCC 2009, Session 5, 5,2, pp. 91-93. 3 pages.
Maffezzoni, Paolo, "Analysis of Oscillator Injection Locking Through Phase-Domain Impulse-Response," IEEE Transactions on Circuits and Systems—I: Regular Papers, vol. 55, No. 5, Jun. 2008, p. 1297-1305. 9 pages.
Mahony et al., "A 27Gb/s Forwarded-Clock I/O Receiver Using an Injection-Locked LC-DCO in 45nm CMOS," 25.1, ISSCC 2008 Session 25, p. 452-453, 627. 3 pages.
Mahony et al., "Paper 25.1: A 27Gb/s Forwarded-Clock I/O Receiver using an Injection-Locked LC-DCO in 45nm CMOS," IEEE International Solid-State Circuits 2008. 39 pages.
Mirzaei, Ahmad et al., "Multi-Phase Injection Widens Lock Range of Ring-Oscillator-Based Frequency Dividers," IEEE Journal of Solid-State Circuits, vol. 43, No. 3, Mar. 2008, pp. 656-671. 16 pages.
NG et al. "A Second-Order Semidigital Clock Recovery Circuit Based on Injection Locking", IEEE Journal of Solid-State Circuits, vol. 38 No. 12, Dec. 2003, pp. 2101-2110, plus corresponding ISSCC 2003 Session 4 paper 4.3. 18 pages.
O'Mahony, Frank et al., "A programmable phase rotator based on time-modulated injection-locking," 2010 IEEE Symposium on VLSI Circuits (VLSIC), pp. 45-46, Jun. 16-18, 2010. 2 pages.
Paciorek, L.J., "Injection Locking of Oscillators," Nov. 1965, Proceedings of the IEEE, vol. 53, No. 11, pp. 1723-1728. 6 pages.
PCT International Preliminary Report on Patentability dated Nov. 14, 2013 (Chapter I) in International Application No. PCT/US2012/034074. 8 pages.
Rategh, H.R., et al., "Superharmonic Injection-Locked Frequency Dividers," IEEE Journal of Solid-State Circuits, 34(6): 813-821 (Jun. 1999). 9 pages.
Razavi, Behzad, "A Study of Injection Locking and Pulling in Oscillators," IEEE Journal of Solid-State Circuits, vol. 39, No. 9, Sep. 2004, p. 1415-1424. 10 pages.
Shekhar, Sudip et al., "Strong Injection Locking in Low-Q LC Oscillators: Modeling and Application in a Forwarded-Clock I/O receiver," IEEE Transactions on Circuits and Systems—I: Regular Papers, vol. 56, No. 8, Aug. 2009, pp. 1818-1829. 12 pages.
Vanassche, et al., "On the Difference between Two Widely Publicized Methods for Analyzing Oscillator Phase Behavior," 2002, IEEE, p. 229-233. 5 pages.
Zhang, Lin et al., "Injection-Locked Clocking: A New GHz Clock Distribution Scheme," IEEE 2006 Custom Integrated Circuits Conference (CICC), pp. 785-788, 4 pages.

\* cited by examiner

DETERMINISTIC JITTER (DJ)

INTEGRATED CIRCUIT HAVING A MULTIPLYING INJECTION-LOCKED OSCILLATOR

RELATED APPLICATION

This patent application is a continuation of U.S. application Ser. No. 14/858,830 (U.S. Pat. No. 9,564,912), having the same title and inventors, filed on 18 Sep. 2015, the contents of which are herein incorporated by reference in their entirety for all purposes. U.S. application Ser. No. 14/858,830 is a continuation of, and claims priority to, U.S. application Ser. No. 14/000,710 (U.S. Pat. No. 9,154,145), having the same title and inventors, filed 21 Aug. 2013, the contents of which are herein incorporated by reference in their entirety for all purposes. U.S. application Ser. No. 14/000,710 is a U.S. National Stage Application of PCT Application No. PCT/US12/34074, having the same title and inventors, filed on 18 Apr. 2012, the contents of which are herein incorporated by reference in their entirety for all purposes. PCT Application No. PCT/US12/34074 claims benefit of U.S. Provisional Application No. 61/481,625, having the same title and inventors, filed on 2 May 2011, the contents of which are herein incorporated by reference in their entirety for all purposes. This patent application claims priority to U.S. Provisional Application No. 61/481,625, filed on 2 May 2011, based on the above-mentioned chain of patent applications.

FIELD

This disclosure generally relates to electronic circuits. This disclosure generally relates to integrated circuit devices that include one or more multiplying injection-locked oscillators.

BACKGROUND

Sometimes circuits are expected to be operated over a range of operating conditions. For example, circuits that are used in mobile devices may be expected to be operated over a range of supply voltages and temperatures, and during the manufacturing of those circuits a range of process variations may result. Changing the operating conditions can change the electrical characteristics of circuit elements, which, in turn, can change the behavior of the circuit. It is desirable to design circuits that can continue to operate with maximum margins across the manufactured variation space even when the operating conditions change.

DETAILED DESCRIPTION

Some embodiments presented in this disclosure feature a MILO which is capable of locking onto an input signal over a range of operating conditions. In some embodiments described herein, the MILO generates an output signal based on an input signal, wherein the output signal frequency is an integer multiple of the input signal frequency. In these embodiments it can be desirable for the range of input frequencies that the MILO can generate be as wide as possible while maintaining low jitter.

Figure 1A:
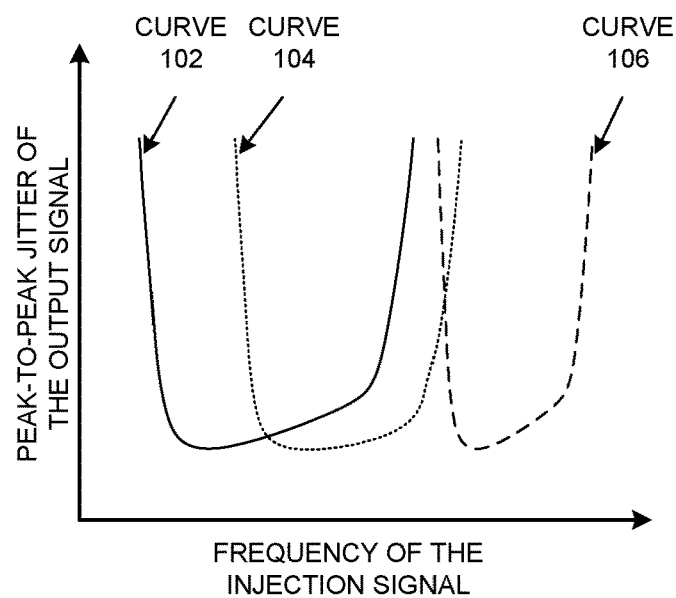
FIG. 1A illustrates a plot of the peak-to-peak jitter versus the injection signal frequency for a multiplying injection-locked oscillator (MILO) under different operating conditions in accordance with some embodiments described in this disclosure.

FIG. 1A illustrates a plot of the peak-to-peak jitter versus the injection (or reference clock) signal frequency for a MILO under various different operating conditions in accordance with some embodiments described in this disclosure.

In some embodiments described herein, it may be desirable to operate the MILO so that the peak-to-peak jitter of the output signal is less than a desired value. According to one definition, when the MILO locks onto the injection signal (and therefore locks onto the input signal), the frequency of the output signal is substantially equal to an integral multiple of the frequency of the input signal, and the peak-to-peak jitter of the output signal is less than a desired value. According to one definition, the locking range of a MILO is defined as the range of input signal frequencies for which the MILO output is an integer multiple of the input signal. According to another definition, the locking range of a MILO is defined as the range of input signal frequencies which result in an output peak-to-peak jitter that is below the desired value.

As shown in FIG. 1A, the peak-to-peak jitter of the output signal can increase as the frequency of the injection signal moves further away from the natural frequency of the MILO. If the frequency of the injection signal is too far away from the natural frequency of the MILO, the MILO can lose its lock on the injection signal and start oscillating at a different frequency, often the natural frequency of the MILO. Since the natural frequency of the MILO can change with changing operating conditions, the locking behavior, and thus the plot of the peak-to-peak jitter versus injection signal frequency can be different for different operating conditions.

FIG. 1A illustrates curves 102, 104, and 106, which can correspond to the peak-to-peak jitter versus the injection signal frequency characteristic for different operating conditions, e.g., different combinations of supply voltages and temperatures. For example, curve 102 can correspond to a low supply voltage and high temperature, curve 104 can correspond to a nominal supply voltage and temperature, and curve 106 can correspond to a high supply voltage and low temperature.

Note that, in FIG. 1A, there is no frequency range where all three curves overlap. In other words, there is no range of injection signal frequencies that will produce an acceptable peak-to-peak jitter across the three operating conditions shown in FIG. 1A.

In some embodiments, the natural frequency of the MILO may be modified by adjusting trim settings of the MILO. Specifically, when a device that includes a MILO is turned on, the device can adjust trim settings of the MILO so that the natural frequency of the MILO is such that the output signal frequency that is desired to be outputted is within the locking range of the MILO. For example, if the MILO includes an injection-locked oscillator, the trim settings of the MILO can control the delay of each delay element in the injection-locked oscillator, thereby allowing the natural frequency of the injection-locked oscillator to be adjusted. Specifically, in some embodiments, a phase detector can be used to detect a phase difference between the output of the MILO and the input signal, and the output of the phase detector can be used to adjust the trim settings. In other embodiments a divider can be coupled to the MILO output and programmed to divide back down by the MILO multiplication ratio, followed by a comparison of the divided MILO output and its input.

In some embodiments described herein, the peak-to-peak jitter versus the injection signal frequency curves overlap for different operating conditions, thereby creating a frequency range over which the MILO locks onto the input signal across a given set of operating conditions.

Figure 1B:
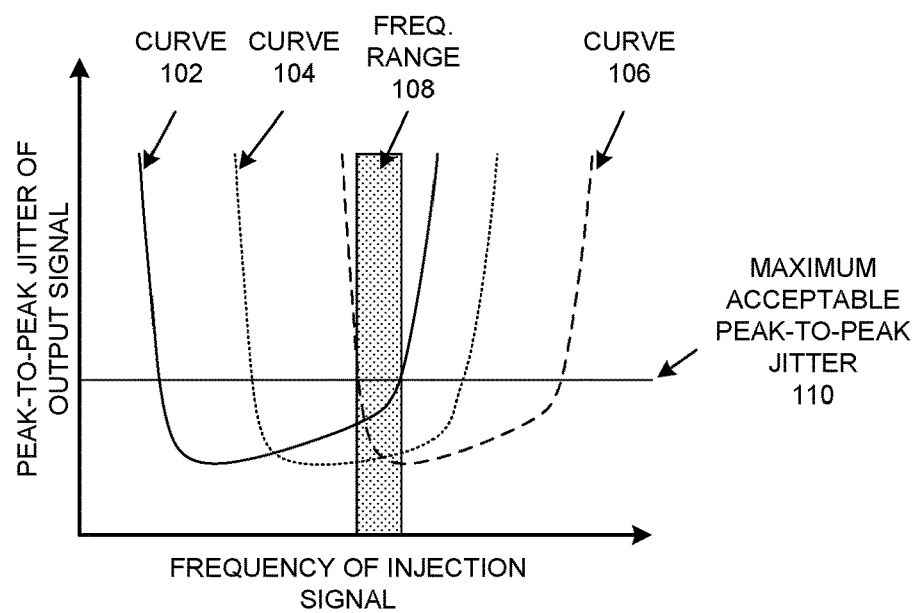
FIG. 1B illustrates a plot of the peak-to-peak jitter versus the injection signal frequency for a MILO under different operating conditions in accordance with some embodiments described in this disclosure.

For example, FIG. 1B illustrates a plot of the peak-to-peak jitter versus the injection signal frequency for such a MILO under different operating conditions in accordance with some embodiments described in this disclosure.

In FIG. 1B, curves 102, 104, and 106 plot the peak-to-peak jitter versus the injection signal frequency for a MILO under different operating conditions, e.g., different combinations of supply voltages and temperatures. Note that the three curves overlap in frequency range 108. If the injection signal frequency is within frequency range 108, the MILO will lock onto the injection signal (and therefore the input signal) under all three operating conditions illustrated in FIG. 1B. As shown in FIG. 1B, if the injection signal frequency is within frequency range 108, the output peak-to-peak jitter is less than or equal to the maximum acceptable peak-to-peak jitter 110. Therefore, if operated within these conditions, the MILO does not need to be calibrated each time it is turned on, because, regardless of the operating conditions, the MILO will lock onto the input signal.

Some embodiments described in this disclosure feature a MILO whose locking ranges for a given trim setting across all operating conditions of interest overlap for a range of frequencies, e.g., a MILO whose locking ranges are shown in FIG. 1B. Note that, such a MILO does not need any additional circuitry to adjust the natural frequency when the device is turned on and the MILO can lock onto the input signal without incurring any additional delay to tune the natural frequency of the MILO.

In some embodiments, the trim settings in the MILO can be adjusted once (e.g., when the device is turned on for the first time) to account for process variations during manufacturing and for desired output frequency. Specifically, the trim settings can be adjusted so that the input signal frequency is within the range of valid operational frequencies (e.g., frequency range 108) where the locking ranges of the different operating conditions overlap.

Figure 2:
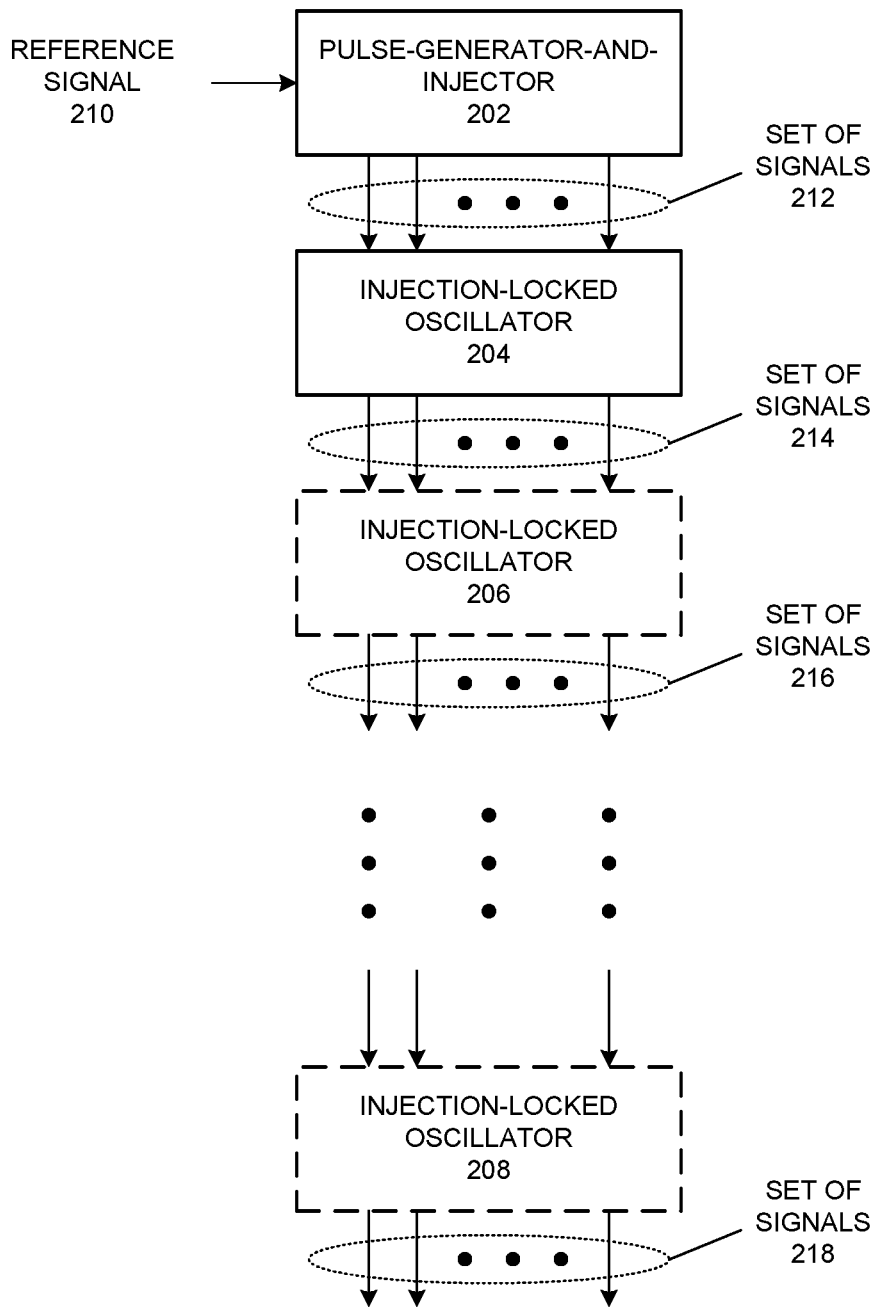
FIG. 2 illustrates a MILO in accordance with some embodiments described in this disclosure.

FIG. 2 illustrates a MILO in accordance with some embodiments described in this disclosure.

Some embodiments described herein feature a MILO which includes a pulse-generator-and-injector and one or more injection-locked oscillators. For example, in some embodiments, the MILO shown in FIG. 2 can include pulse-generator-and-injector 202 and one injection-locked oscillator, e.g., injection-locked oscillator 204. In some embodiments, the MILO can include two or more injection-locked oscillators, such as injection-locked oscillators 206 through 208 (injection-locked oscillators 206 through 208 are shown using dashed lines to indicate that they are optional). Pulse-generator-and-injector 202 can generate set of signals 212 based on reference signal 210. Each signal in set of signals 212 can be a sequence of pulses, and each signal in set of signals 212 can have a different phase with respect to other signals in set of signals 212. For example, the signals in set of signals 212 can be delayed versions of a sequence of pulses.

In some embodiments, each injection-locked oscillator can have multiple injection points for receiving multiple injection signals and multiple outputs for outputting multiple output signals. The output signals from an injection-locked oscillator can be oscillating signals or clock signals (as opposed to being sequences of pulses) with different phases. In embodiments that have one injection-locked oscillator, the output signals from the injection-locked oscillator, e.g., set of signals 214, can be used to generate the output signal of the MILO.

In embodiments that have two or more injection-locked oscillators, the output signals from each injection-locked oscillator can be injected into the corresponding multiple injection points of the next injection-locked oscillator. For example, each signal in set of signals 212 can be injected into the corresponding injection point of injection-locked oscillator 204. Each output signal from injection-locked oscillator 204 (i.e., each signal in set of signals 214) can be injected into the corresponding injection point of injection-locked oscillator 206, and each output signal from injection-locked oscillator 206 (i.e., each signal in set of signals 216) can be injected into the corresponding injection point of the next injection-locked oscillator, and so forth.

The output signals from the last injection-locked oscillator can be used to generate the output signal of the MILO. For example, one of the output signals from injection-locked oscillator 208 (i.e., set of signals 218) can be used as the output signal of the MILO.

In some embodiments a pulse converter is inserted between the output of one oscillator and the input port of the next oscillator. The pulse converter serves to convert a normal clock waveform into a series of pulses, each pulse corresponding to each edge (or each rising or falling edge) of the normal clock waveform.

Figure 3A:
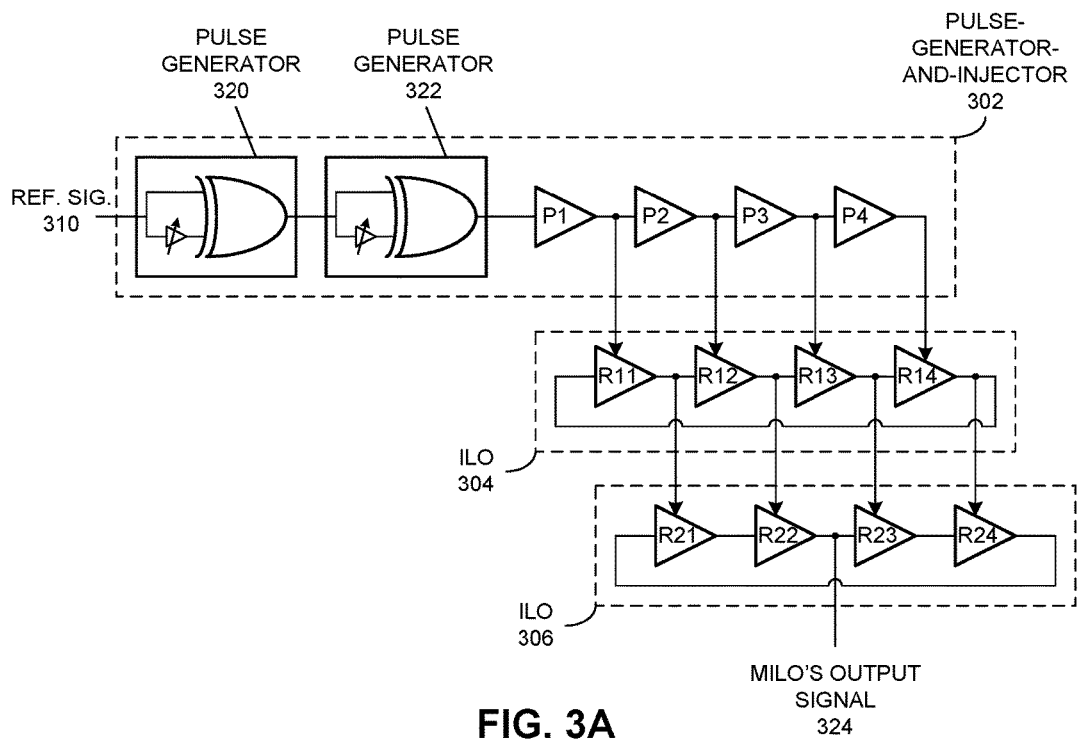
FIG. 3A illustrates a MILO in accordance with some embodiments described in this disclosure.

FIG. 3A illustrates a MILO in accordance with some embodiments described in this disclosure. The MILO illustrated in FIG. 3A includes pulse-generator-and-injector 302, and injection-locked oscillators 304 and 306.

Pulse-generator-and-injector 302 can include pulse generators 320 and 322, and delay elements P1-P4. Pulse generator 320 can receive reference signal 310 and generate a first sequence of pulses which can be provided as input to pulse generator 322. The number of edges in the first sequence of pulses can be twice the number of edges in reference signal 310 over the same time period. Pulse generator 322 can then generate a second sequence of pulses that has twice the number of edges than the number of edges in the first sequence of pulses over the same time period. In this manner, the output signal of pulse generator 322 can have four times the number of edges in reference signal 310 over a given time period.

The output of pulse generator 322 can then be provided as input to the delay chain comprising delay elements P1-P4. As shown in FIG. 3A, the output signals from delay elements P1-P4 can be injected into corresponding delay elements R11-R14 of injection-locked oscillator 304. In some embodiments the design of delay elements P1-P4 matches that of delay elements R11-R14 in order for the injection pulses to arrive at the same relative phase at delay elements R11-R14.

In some embodiments described in this disclosure, the sequence of pulses generated by pulse generator 322 may not have equal widths and/or may not have the same amplitude. These variations in the width and/or amplitude of the pulses can show up as deterministic jitter in the output signals from injection-locked oscillator 304. In some embodiments, the amount of deterministic jitter in the output signals can be reduced by adding more injection-locked oscillator blocks to the MILO. Specifically, in some embodiments, the output signals from injection-locked oscillator 304 can be injected into corresponding injection points in another injection-locked oscillator, e.g., injection-locked oscillator 306. Specifically, as shown in FIG. 3A, the outputs from delay elements R11-R14 of injection-locked oscillator 304 can be injected into corresponding delay elements R21-R24 of injection-locked oscillator 306.

In some embodiments described herein, the output signals from delay elements R21-R24 can be used to generate the output of the MILO. Specifically, in some embodiments, the output signal from one of the delay elements in the last injection-locked oscillator can be output as the MILO's output signal. For example, as shown in FIG. 3A, the output from delay element R22 can be output as the MILO's output signal 324. In some embodiments other outputs in the delay chain can be used, and in some embodiments all outputs can be used to provide separately spaced vectors for interpolation, edge detection, or other purposes.

In some embodiments described herein, the delay elements in the injection-locked oscillators can use differential signals. However, differential signals have not been shown in FIG. 3A for the sake of clarity and ease of discourse.

Figure 3B:
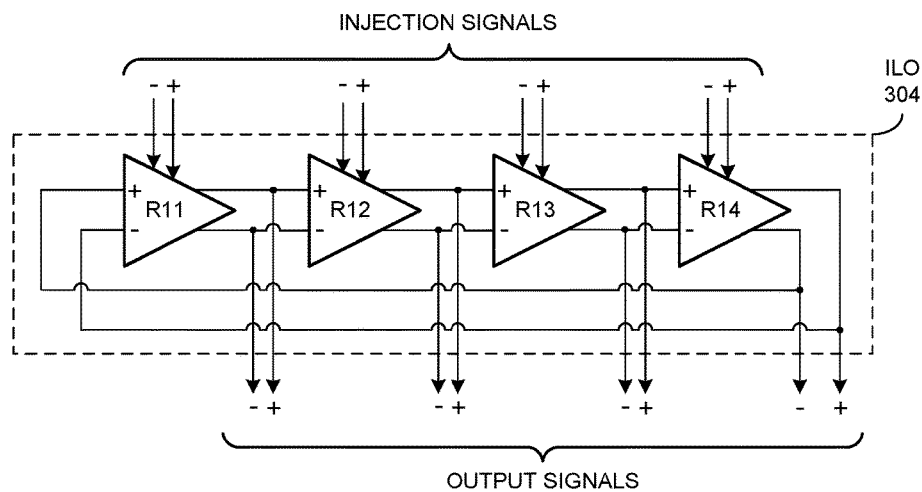
FIG. 3B illustrates an injection-locked oscillator in accordance with some embodiments described in this disclosure.

FIG. 3B illustrates a 4-stage injection-locked oscillator in accordance with some embodiments described in this disclosure.

Injection-locked oscillator 304 can include delay elements R11-R14 arranged in a loop. As shown in FIG. 3B, each delay element can receive and output differential signals. In some embodiments, one or more stages of the injection-locked oscillator may invert the signal. For example, as shown in FIG. 3B, the differential outputs of delay element R14 are provided to the opposite polarity inputs of delay element R11 (e.g., the "+" and "−" outputs of delay element R14 can be coupled with the "−" and "+" inputs of delay element R11, respectively).

Figure 3C:
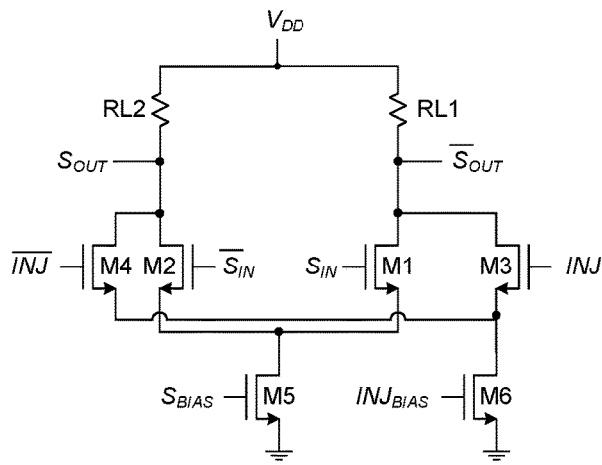
FIG. 3C illustrates a delay element of an injection-locked oscillator in accordance with some embodiments described in this disclosure.

FIG. 3C illustrates a delay element of an injection-locked oscillator in accordance with some embodiments described in this disclosure. The delay element illustrated in FIG. 3C can correspond to a delay element shown in FIG. 3B, e.g., delay element R11.

The delay element shown in FIG. 3C can include differential transistor pair M1 and M2 which can receive the differential input signal $S_{IN}$ and $\overline{S}_{IN}$ as input, and differential transistor pair M3 and M4 which can receive the differential injection signal INJ and $\overline{INJ}$ as input. Transistors M5 and M6 can act as current sources for the differential pairs, and their currents can be controlled by bias signals $s_{BIAS}$ and $INJ_{BIAS}$, respectively. RL1 and RL2 can be load resistances, and $V_{DD}$ can be the supply voltage. The differential output signal $S_{OUT}$ and $\overline{S}_{OUT}$ can be based on the sum of the drain currents of the corresponding transistors in the differential pairs. Specifically, output signal $S_{OUT}$ is based on the sum of the drain currents of transistors M2 and M4, and output signal $\overline{S}_{OUT}$ is based on the sum of the drain currents of transistors M1 and M3.

The injection strength can be modified by adjusting the strength of $S_{BIAS}$ and $INJ_{BIAS}$ relative to one another. For example, injection strength can be increased by increasing $INJ_{BIAS}$ and/or decreasing $S_{BIAS}$. Conversely, injection strength can be decreased by decreasing $INJ_{BIAS}$ and/or increasing $S_{BIAS}$. In some embodiments, the total current into the load is maintained at a constant level, i.e., a constant swing is developed across $S_{OUT}$ and $\overline{S}_{OUT}$. In some embodiments, the injection strength used for injecting the sequence of pulses into injection-locked oscillator 304 is greater than the injection strength used to inject the output of injection-locked oscillator 304 into injection-locked oscillator 306.

Figure 3D:
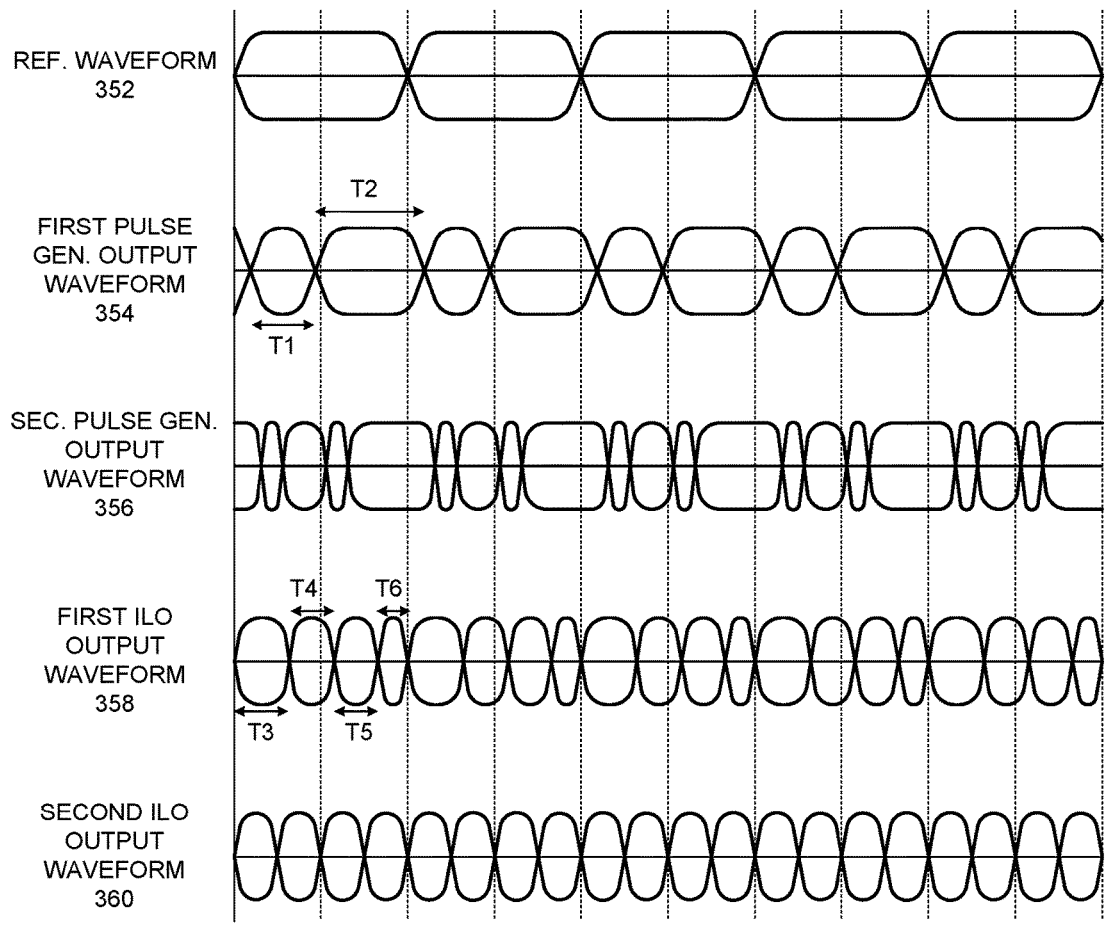
FIG. 3D illustrates waveforms associated with the MILO shown in FIG. 3A in accordance with some embodiments described in this disclosure.

FIG. 3D illustrates waveforms associated with the MILO shown in FIG. 3A in accordance with some embodiments described in this disclosure. The differential signal waveforms shown in FIG. 3D are for illustration purposes only, and are not intended to limit the scope of the described embodiments.

Reference waveform 352 can correspond to reference signal 310. First pulse generator output waveform 354 can correspond to the output signal of pulse generator 320. Note that the positive and negative pulses have different widths (shown as T1 and T2 in FIG. 3D). Second pulse generator output waveform 356 can correspond to the output signal of pulse generator 322. In some embodiments, the pulses in the output signal of pulse generator 322 have different widths.

Specifically, in some embodiments, the variation of the pulse width and/or amplitude can be systematic (e.g., the variation may repeat with a given periodicity). For example, the second pulse generator output waveform 356 has the following deterministic pulse width pattern: a narrow positive pulse, a narrow negative pulse, a narrow positive pulse, and a wide negative pulse. As explained below, this systematic variation in the width and/or amplitude of the pulses can result in deterministic jitter in the output signal of the injection-locked oscillator. In some embodiments the variations in pulse widths can be reduced by adjustment of delay parameters inside pulse generators 320 and 322. In order to not add latency to the clock turn-on however, such adjustments are typically made once on system power up and/or during periodic calibration cycles and are not adjusted during transitions from idle to active states. Drift in temperature and/or power supply levels can cause variations in the adjustment points of the internal pulse generator delays that result in the output waveforms still containing non-matching spaces between pulses as shown in 356.

First injection-locked oscillator output waveform 358 can correspond to the output signals of injection-locked oscillator 304. Since the injection signal that was injected into injection-locked oscillator 304 was a sequence of pulses with varying pulse widths, the output signals of injection-locked oscillator 304 may have deterministic jitter. The deterministic jitter pattern is shown in FIG. 3D by the different pulse widths T3-T6. Note that the deterministic jitter pattern shown in FIG. 3D repeats after every four pulses. In some embodiments, the deterministic jitter in an output signal of a MILO has a periodicity (measured in UI) that is equal to the multiplicative factor of the MILO. Since a MILO can lock to any integer sub-harmonic within its locking range, the multiplication ratio can be another integer value such as 1, 2, 3, 5, 6, 7, etc.

Second injection-locked oscillator output waveform 360 can correspond to the output signals of injection-locked oscillator 306. Note that the amount of deterministic jitter in second injection-locked oscillator output waveform 360 may be less than the amount of deterministic jitter in the first injection-locked oscillator output waveform 358.

Figure 4:
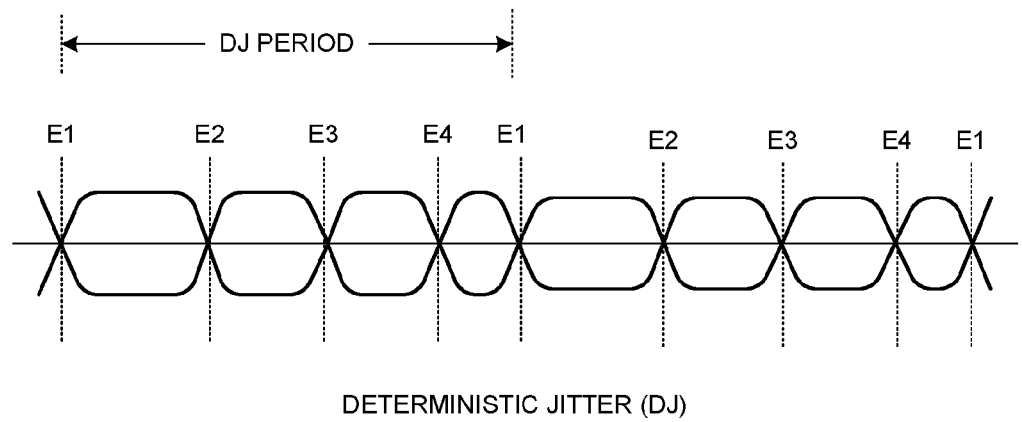
FIG. 4 illustrates a signal waveform with deterministic jitter in accordance with some embodiments described in this disclosure.

FIG. 4 illustrates a signal waveform with deterministic jitter in accordance with some embodiments described in this disclosure. For example, the signal waveform shown in FIG. 4 may correspond to the output signal of injection-locked oscillator 304 shown in FIG. 3A.

The deterministic jitter shown in FIG. 4 repeats after every four pulses. Edges E1, E2, E3, and E4 can correspond to the beginning of the first, second, third, and fourth pulses in the repeating pattern. The deterministic jitter period is equal to the worst-case difference in the time between two En edges (where "En" is one of E1-E4) and a delay of $1/(2 \cdot f_0)$, where $f_0$ is the target oscillation frequency.

In some embodiments, deterministic jitter (such as the one shown in FIG. 4) can be further reduced by using one or more of the following techniques: adjusting the pulse widths by dynamically modifying the loop length of an injection-locked oscillator, using a duty cycle correction circuit, and/or blending or multiplexing the outputs from multiple delay elements of an injection-locked oscillator. Some embodiments for reducing the deterministic jitter are described below.

Figure 5A:
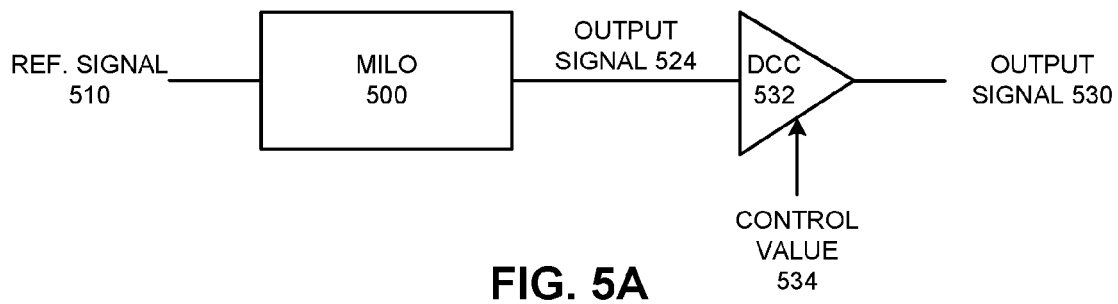
FIG. 5A illustrates how deterministic jitter can be reduced by using a duty cycle corrector in accordance with some embodiments described in this disclosure.

FIG. 5A illustrates how deterministic jitter can be reduced by using a duty cycle corrector in accordance with some embodiments described in this disclosure.

In some embodiments described herein, MILO 500 can generate output signal 524 based on reference signal 510. Output signal 524 may have deterministic jitter, such as the deterministic jitter shown in FIG. 4. The narrower the pulse width, the greater the bandwidth required in the clock path to pass the pulse with an acceptable level of fidelity. Therefore, the narrowest pulse width in the deterministic jitter (e.g., the pulse between edges E4 and E1 in FIG. 4) can dictate the amount of bandwidth that is required to pass the pulse with an acceptable level of fidelity. Generally higher bandwidths are achieved only through increasing power, and so a narrow pulse width can waste power. Further, use of a narrow pulse-width can reduce timing margin when the clock is used to time I/O transmitters or receivers.

In some embodiments, a duty cycle corrector can be used to increase the width of the narrowest pulse in the output signal of a MILO. Specifically, as shown in FIG. 5A, duty cycle corrector 532 can generate output signal 530 based on output signal 524 from MILO 500. Duty cycle corrector 532 can adjust the duty cycle of the output signal based on control value 534.

Figure 5B:
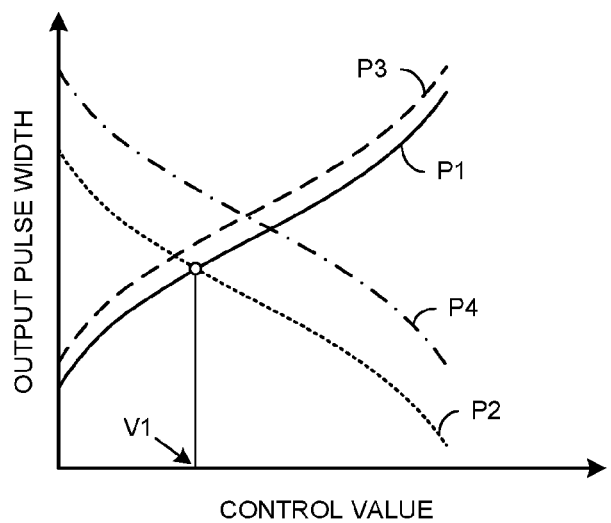
FIG. 5B illustrates a plot of the output pulse widths versus the control value for a duty cycle corrector in accordance with some embodiments described in this disclosure.

FIG. 5B illustrates a plot of the output pulse widths versus the control value for a duty cycle corrector in accordance with some embodiments described in this disclosure.

Curves P1-P4 shown in FIG. 5B can correspond to the variation in the width of four consecutive pulses in output signal 530 with respect to control value 534 that is provided to duty cycle corrector 532. The width of the first and third pulse (curves P1 and P3, respectively) increases when the control value is increased. The width of the second and fourth pulses (curves P2 and P4, respectively) decreases when the control value is increased.

In some embodiments, control value 534 of DCC 532 can be set so that the width of the narrowest pulse is substantially equal to the width of the second narrowest pulse. In these embodiments the DCC settings are not adjusted to compensate for the overall output DCC, which is necessarily a function of the other two pulse widths in this example. Rather, the adjustment is made to improve the minimum pulse width. This pulse width is thus increased at the expense of the adjacent two pulse widths. In some embodiments, control value 534 that is received at a control input of DCC 532 can be set so as to maximize the width of the narrowest pulse in output signal 530 relative to the ideal pulse-width.

Figure 5C:
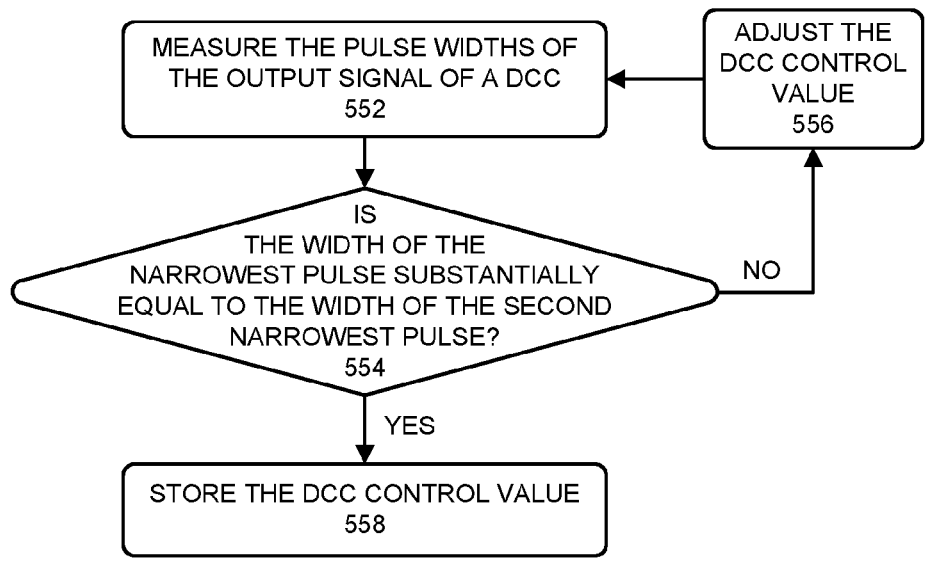
FIG. 5C presents a flowchart that illustrates a process for determining a control value for a duty cycle corrector in accordance with some embodiments described in this disclosure.

FIG. 5C presents a flowchart that illustrates a process for determining a control value for a duty cycle corrector in accordance with some embodiments described in this disclosure. In some embodiments described herein, the process may begin with measuring the pulse widths of the output signal of a DCC (operation 552). Next, the system can determine whether the width of the narrowest pulse is substantially equal to the width of the second narrowest pulse (operation 554). If so ("YES" branch), the system can store the corresponding DCC control value (operation 558). Otherwise ("NO" branch), the system can adjust the DCC control value (operation 556), and again measure the pulse widths of the output signal of the DCC (operation 552). For a given set of pulse-width values, the narrowest pulse width may correspond to the minimum pulse-width value, and the second narrowest pulse may correspond to the second minimum pulse-width value. In some embodiments, the process shown in FIG. 5C can be performed on system startup, and may not need to be performed after that because the MILO pulse widths for a given frequency and operating point are not expected to change substantially.

In some embodiments the measurement of the narrowest pulse width can be accomplished by running link timing margin bit-error-rate tests and maximizing the size (equivalent to timing margin) of the passing region.

Figure 6A:
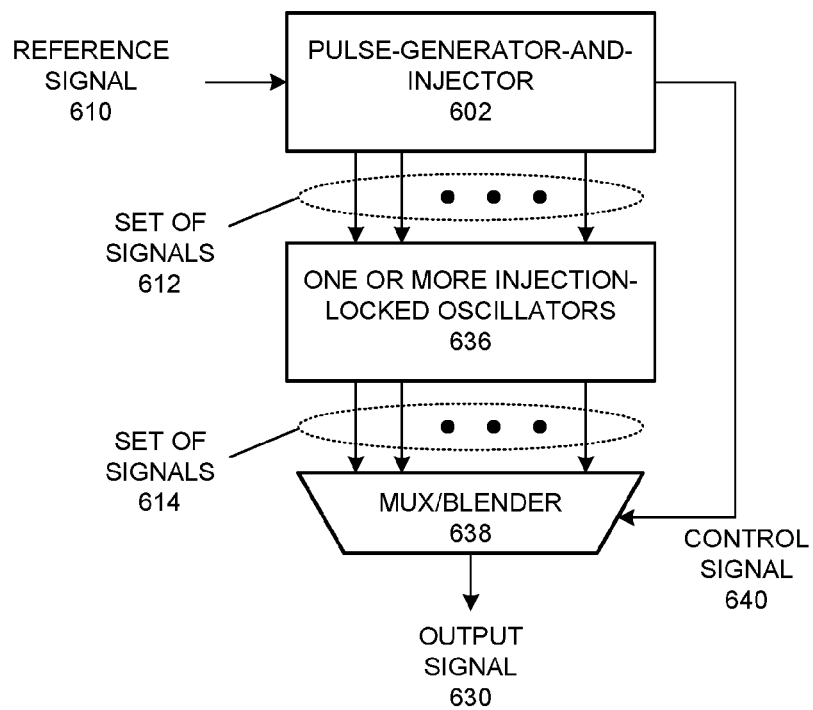
FIG. 6A illustrates how deterministic jitter can be reduced by using a multiplexer/blender in accordance with some embodiments described in this disclosure. In this disclosure, the term "multiplexer/blender" generally refers to a circuit that is capable of selecting a signal from a set of signals and/or blending two or more signals from a set of signals.

FIG. 6A illustrates how deterministic jitter can be reduced by using a multiplexer/blender in accordance with some embodiments described in this disclosure.

In some embodiments described herein, a MILO can include pulse-generator-and-injector 602, one or more injection-locked oscillators 636, and multiplexer/blender 638. Pulse-generator-and-injector 602 can generate set of signals 612 based on reference signal 610. Each signal in set of signals 612 can be a sequence of pulses. Set of signals 612 can be injected into one or more injection-locked oscillators 636 configured as shown in FIG. 2. Each signal in set of signals 614 can be a clock signal. The last injection-locked oscillator in the one or more injection-locked oscillator 638 can generate the set of output signals 614. Two or more outputs from the last injection-locked oscillator in the one or more injection-locked oscillators 636 can be provided as input to multiplexer/blender 638. The output signal from the multiplexer/blender 638 can then be outputted as the output signal 630 of the MILO.

In some embodiments, the signals in the set of signals 614 may include deterministic jitter, and a relationship may exist between the deterministic jitter and the timing of the pulses generated by pulse-generator-and-injector 602. In some embodiments, this timing relationship can be used to generate control signal 640 for multiplexer/blender 638. For example, as shown in FIG. 6A, pulse-generator-and-injector 602 may generate control signal 640. In some embodiments, control signal 640 is used by multiplexer/blender 638 to blend or partially swap a "good" edge for a "bad" edge, thereby reducing the amount of deterministic jitter in the output signal 630.

Figure 6B:
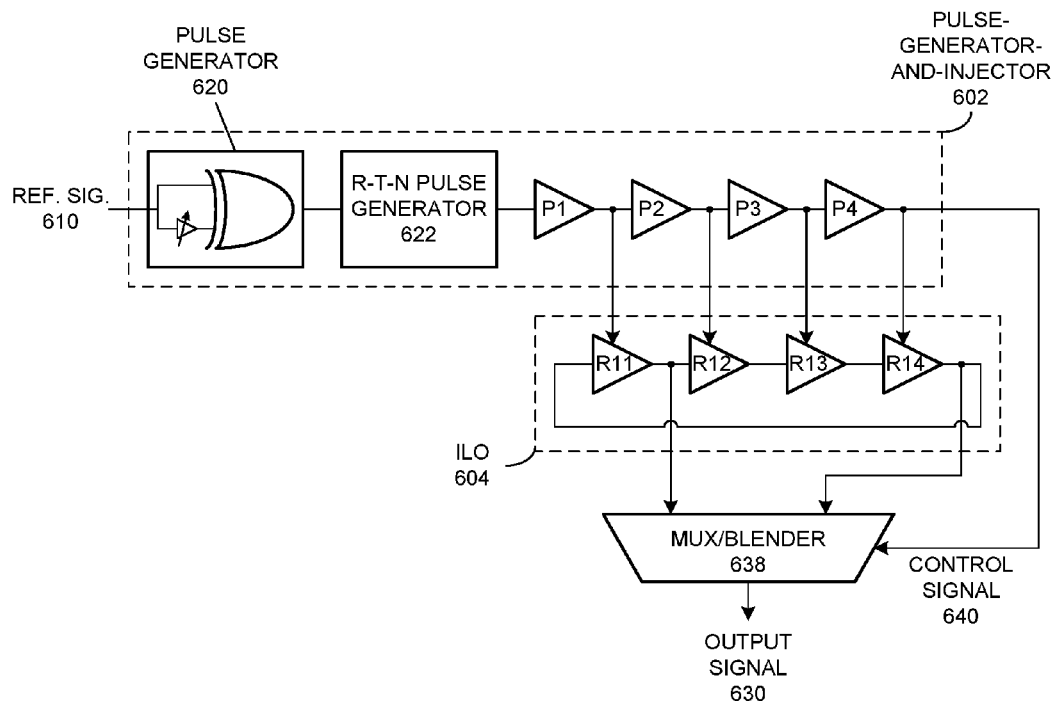
FIG. 6B illustrates how deterministic jitter can be reduced by using a multiplexer/blender in accordance with some embodiments described in this disclosure.

FIG. 6B illustrates how deterministic jitter can be reduced by using a multiplexer/blender in accordance with some embodiments described in this disclosure.

In some embodiments described herein, pulse-generator-and-injector 602 can include pulse generator 620, return-to-null pulse generator 622, and delay elements P1-P4. Pulse generator 620 can receive reference signal 610 and generate a sequence of pulses which can be provided as input to return-to-null pulse generator 622. The frequency of the sequence of pulses can be an integer multiple of the frequency of reference signal 610.

Figure 6C:
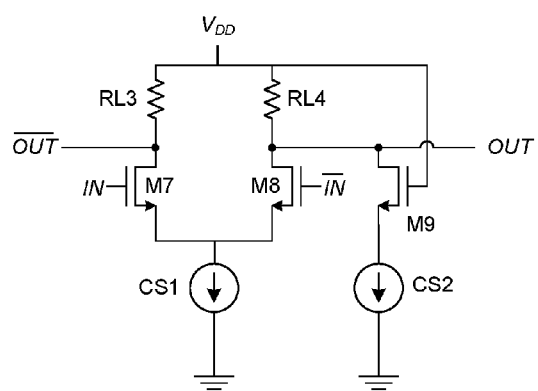
FIG. 6C illustrates a return-to-null pulse generator in accordance with some embodiments described in this disclosure.

FIG. 6C illustrates a return-to-null pulse generator, e.g., return-to-null pulse generator 622, in accordance with some embodiments described in this disclosure. A return-to-null pulse generator can be used in some embodiments between different ring-oscillators in order to convert individual edges into injection pulses with the result that the second oscillator will have better output jitter and/or a greater locking range.

The return-to-null pulse generator shown in FIG. 6C can include differential transistor pair M7 and M8 which can receive the differential input signal IN and $\overline{\text{IN}}$. The sources of transistors M7 and M8 can be coupled with current source CS1, and the drains of transistors M7 and M8 can provide the differential output signal OUT and $\overline{\text{OUT}}$. RL3 and RL4 can be load resistances, and $V_{DD}$ can be the supply voltage. The drain of transistor M9 can be coupled to the drain of transistor M8, and the source of transistor M9 can be coupled to current source CS2. The gate of transistor M9 can be coupled to $V_{DD}$ or a suitably high voltage so that transistor M9 remains on.

When signal IN is high and signal $\overline{\text{IN}}$ is low, transistor M7 is on, and transistor M8 is off, and when signal IN is low and signal $\overline{\text{IN}}$ is high, transistor M7 is on, and transistor M8 is off. In some embodiments, RL3, RL4, CS1, and CS2 can be selected so that (1) when signal IN is high and signal $\overline{\text{IN}}$ is low, signals OUT and $\overline{\text{OUT}}$ have the same voltage (hereinafter referred to as the "null" voltage), and (2) when signal IN is low and signal $\overline{\text{IN}}$ is high, signals OUT and $\overline{\text{OUT}}$ diverge in opposite directions from the "null" voltage by the same amount.

For example, if we neglect the drain current of transistor M8 when transistor M8 is off, then these two criteria can be satisfied by embodiments in which RL3 and RL4 have the same resistance value, and current sources CS1 and CS2 draw the same amount of current. In these embodiments, when signal IN is high and signal $\overline{\text{IN}}$ is low, signals OUT and $\overline{\text{OUT}}$ have the same voltage because current sources CS1 and CS2 draw the same amount of current through resistances RL3 and RL4, thereby causing the voltage drop across RL3 and RL4 to be the same. On the other hand, when signal IN is low and signal $\overline{\text{IN}}$ is high, signals OUT and $\overline{\text{OUT}}$ diverge in opposite directions from the "null" voltage by the same amount because substantially zero current flows through RL3 and both CS1 and CS2 draw current through RL4, thereby causing the voltage drop across RL3 to be substantially zero and the voltage drop across RL4 to be equal to double the voltage drop required to generate the "null" voltage.

Figure 6D:
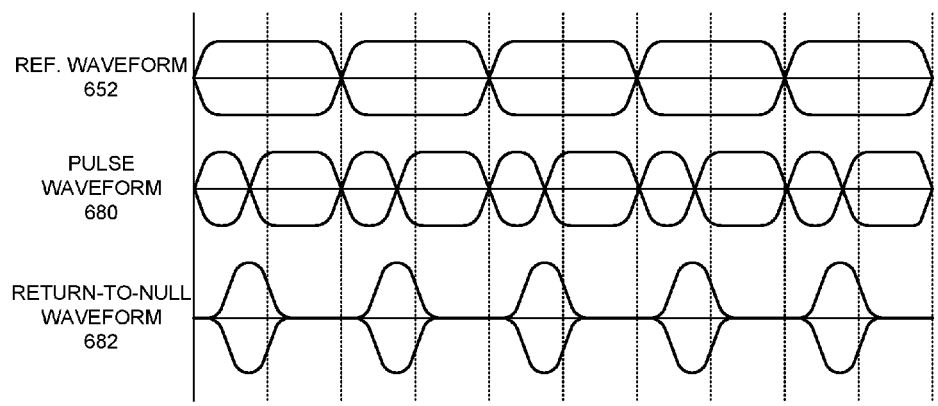
FIG. 6D illustrates waveforms associated with a return-to-null pulse generator in accordance with some embodiments described in this disclosure.

FIG. 6D illustrates waveforms associated with a return-to-null pulse generator (e.g., return-to-null pulse generator 622) in accordance with some embodiments described in this disclosure. The differential signal waveforms shown in FIG. 6D are for illustration purposes only, and are not intended to limit the scope of the described embodiments.

Reference waveform 652 can correspond to reference signal 610, pulse waveform 680 can correspond to the output signal of pulse generator 620, and return-to-null waveform 682 can correspond to the output signal of return-to-null pulse generator 622.

In some embodiments described herein, the output of return-to-null pulse generator 622 can be provided as input to the delay chain comprising delay elements P1-P4. As shown in FIG. 6B, the output signals from delay elements P1-P4 can be injected into corresponding delay elements R11-R14 of injection-locked oscillator 604. In some embodiments, the frequency of injection-locked oscillator 604 can be an integer multiple (e.g., two, four, or eight times) of the frequency of reference signal 610. The output signals of delay elements R11-R14 may have deterministic jitter because the frequency of the sequence of pulses generated by return-to-null pulse generator 622 is an integer sub-multiple of the frequency of injection-locked oscillator 604.

In some embodiments, the amount of deterministic jitter can be reduced by multiplexing and/or blending the output signals of two or more delay elements of injection-locked oscillator 604. Specifically, in some embodiments, the output signals from two delay elements in injection-locked oscillator 604 (e.g., delay elements R11 and R14) can be provided as inputs to multiplexer/blender 638, and the output of a delay element in pulse-generator-and-injector 602 (e.g., delay element P4) can be provided as the control signal 640 to multiplexer/blender 638.

The configuration shown in FIG. 6B is based on a timing relationship between the sequence of pulses outputted by return-to-null pulse generator 622 and the output signals of delay elements R11-R14. It will be apparent to one skilled in the art that a different configuration may be used if the timing relationship between the sequence of pulses outputted by return-to-null pulse generator 622 and the output signals of delay elements R11-R14 is different.

Figure 6E:
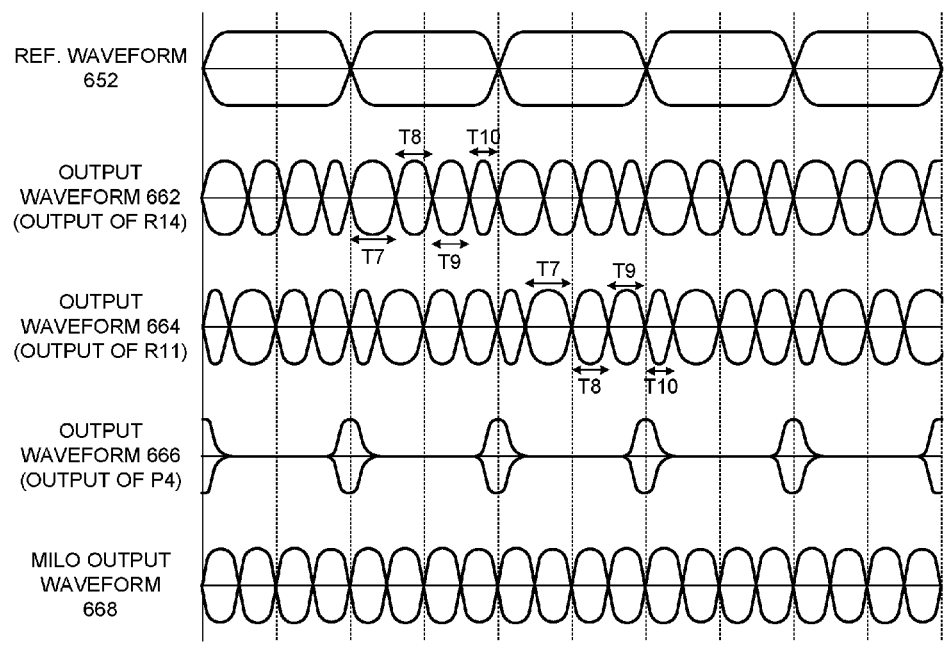
FIG. 6E illustrates waveforms associated with the MILO shown in FIG. 6B in accordance with some embodiments described in this disclosure.

FIG. 6E illustrates waveforms associated with the MILO shown in FIG. 6B in accordance with some embodiments described in this disclosure. The differential signal waveforms shown in FIG. 6E are for illustration purposes only, and are not intended to limit the scope of the described embodiments.

Reference waveform 652 can correspond to reference signal 610. Output waveform 662 can correspond to the output signal of delay element R14 of injection-locked oscillator 604. Output waveform 664 can correspond to the output signal of delay element R11 of injection-locked oscillator 604. Note that output waveform 664 is an inverted and delayed version of output waveform 662.

Output waveform 666 can correspond to the output signal of delay element P4 of pulse-generator-and-injector 602. Note that output waveform 666 illustrates return-to-null pulses.

The output signal of delay element R14 may have deterministic jitter, as shown in output waveform 662. Specifically, the deterministic jitter may include a repeating pattern of four pulses whose widths are T7, T8, T9, and T10. Pulse width T7 corresponds to the widest pulse and pulse width T10 corresponds to the narrowest pulse. Note that the output of delay element R11 (output waveform 664) may have the same deterministic jitter as the output of delay element R14 (output waveform 662).

As shown in FIG. 6E, each pulse in the output signal of delay element P4 may coincide with the rising edge of the widest pulse in the output signal of delay element R14 and the falling edge of the narrowest pulse in the output signal of delay element R11. In some embodiments described herein, the timing relationship between these three signals can be used to reduce the deterministic jitter. Specifically, in some embodiments, multiplexer/blender 638 can be configured to output the signal from delay element R14 when control signal 640 corresponds to the null value, and to output the signal from delay element R11 when control signal 640 does not correspond to the null value. In this configuration, multiplexer/blender 638 blends or switches between the rising/falling edge of the widest pulse and the falling/rising edge of the narrowest pulse, thereby increasing the width of the narrowest pulse and decreasing the width of the widest pulse. As a result, the output signal 630 of the multiplexer/blender 638 has substantially less deterministic jitter, as shown by MILO output waveform 668.

Figure 7:
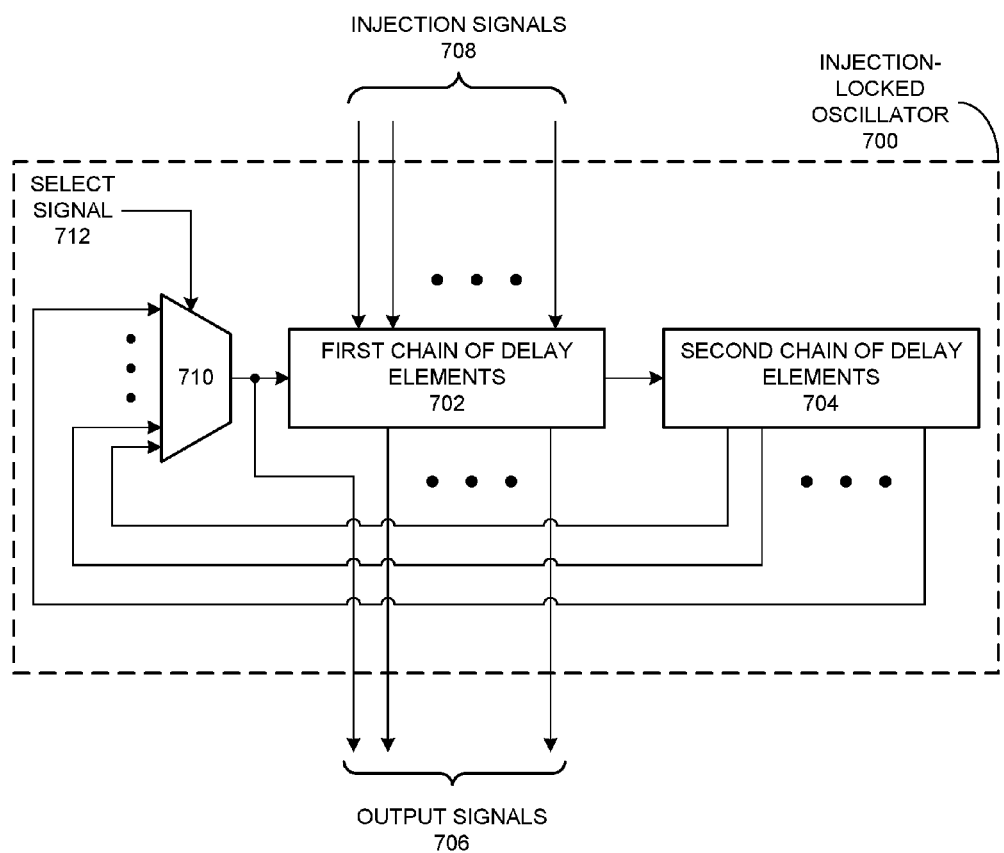
FIG. 7 illustrates an injection-locked oscillator with a configurable loop length in accordance with some embodiments described in this disclosure.

FIG. 7 illustrates an injection-locked oscillator with a configurable loop length in accordance with some embodiments described in this disclosure.

In some embodiments, one or more instances of injection-locked oscillator 700 can be used in a MILO. In some embodiments, injection-locked oscillator 700 can be the last injection-locked oscillator in a MILO that includes multiple injection-locked oscillators. For example, injection-locked oscillator 700 can correspond to injection-locked oscillator 208 in FIG. 2.

Injection-locked oscillator 700 can include multiplexer 710, first set of delay elements 702, and second set of delay elements 704. The outputs from first set of delay elements 702 can be provided as inputs to second set of delay elements 704, the outputs from second set of delay elements 704 can be provided as input to multiplexer 710, and the output of multiplexer 710 can be provided as input to first set of delay elements 702, thereby completing the loop. Select signal 712 can be provided to multiplexer 710 to select an output from one of the delay elements in second set of delay elements 704.

First set of delay elements 702 can receive injection signals 708 and produce output signals 706. For example, injection signals 708 may be received from the previous injection-locked oscillator or from the pulse generator, and output signals 706 may be output as the output signal of the MILO or be provided as injection signals to the next injection-locked oscillator.

In some embodiments described herein, the loop length of injection-locked oscillator 700 can be varied by using select signal 712 to select the appropriate output from second set of delay elements 704. For example, suppose first set of delay elements 702 includes a chain of four delay elements, and second set of delay elements 704 includes a chain of three delay elements. Further, suppose that the output from each of the three delay elements in second set of delay elements 704 is provided as an input to multiplexer 710. Now, select signal 712 can be used to select a total loop length of five, six, and seven delay elements.

In some embodiments described herein, injection-locked oscillator 700 can be used to reduce deterministic jitter in output signals 706. For example, suppose output signals 706 have the deterministic jitter shown in FIG. 4 when the loop length of injection-locked oscillator 700 is kept constant at a nominal value. The deterministic jitter shown in FIG. 4 can be reduced by decreasing the loop length of the injection-locked oscillator from the nominal value when edge E1 appears at the input of first set of delay elements 702, and increasing the loop length of the injection-locked oscillator when edge E4 appears at the input of the first set of delay elements 702. Note that the fundamental frequency of the injection-locked oscillator does not change if the net adjustment in the loop length over a deterministic jitter period is equal to zero. For example, the fundamental frequency of the injection-locked oscillator will not change if the loop length is decreased by one delay element for edge E1 and increased by one delay element for edge E4 because, in this case, the net adjustment in the loop length over a single deterministic jitter period would be equal to zero. Those skilled in the art will understand that a blender (e.g., mixing or interpolating circuits) may be substituted for multiplexer 710 to provide loop lengths and oscillator frequencies in-between the discrete values provided by the relatively coarse adjustment of the addition or subtraction of a complete delay element.

Figure 8A:
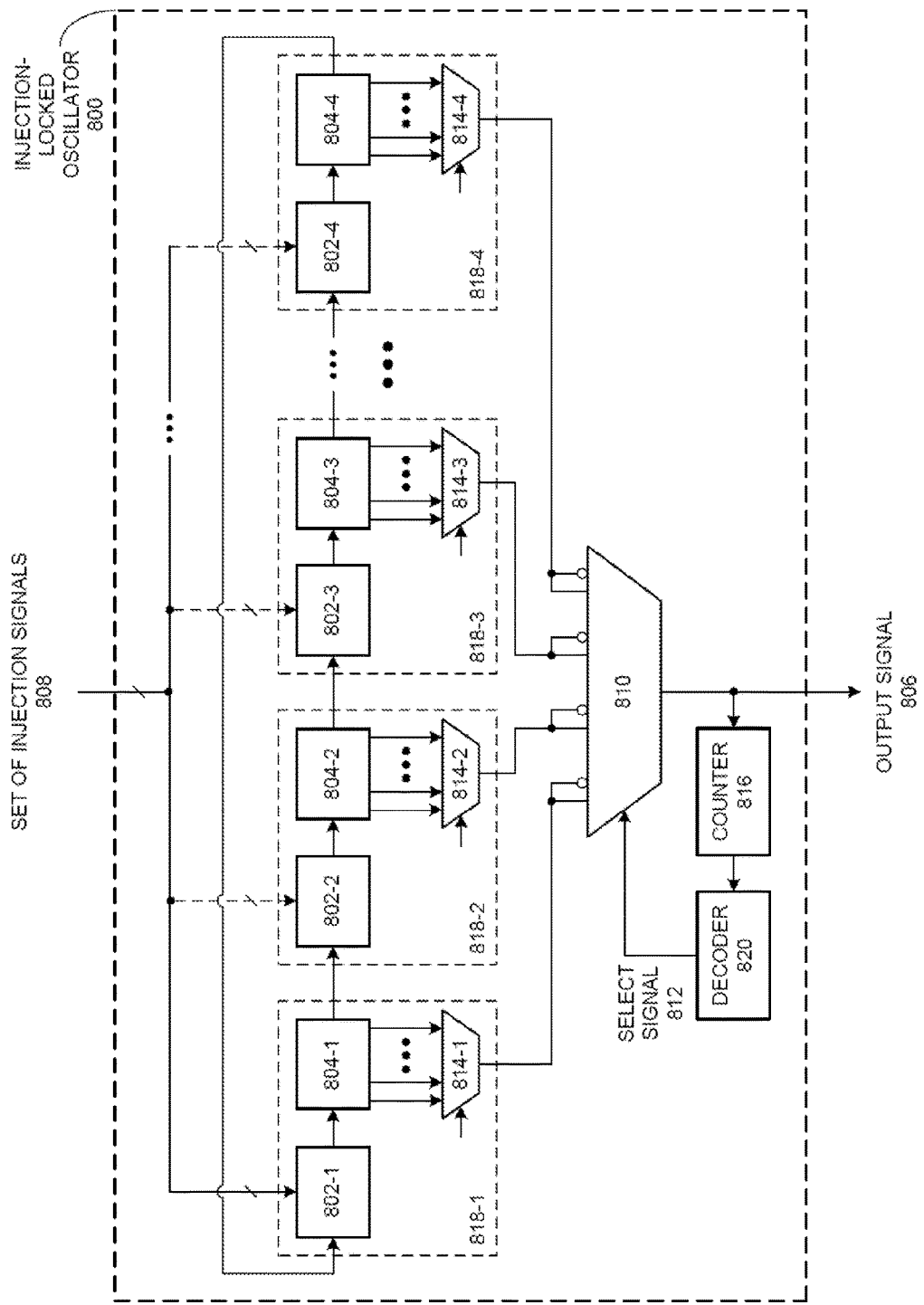
FIG. 8A illustrates an unwrapped adjustable loop-length oscillator in accordance with some embodiments described in this disclosure.

FIG. 8A illustrates an unwrapped adjustable loop-length injection-locked oscillator in accordance with some embodiments described in this disclosure. The injection-locked oscillator illustrated in FIG. 8 has four sub-ring stages. Injection-locked oscillators that have fewer or more sub-ring stages will be readily apparent to those skilled in the art based on the embodiments described in this disclosure.

As described herein, an injection-locked oscillator with a configurable loop length can include an arbitrary number of sub-ring stages. The sub-ring stages can be configured so that the injection-locked oscillator loop inverts the signal. For example, this can be accomplished by performing an odd number of inversions in the injection-locked oscillator loop. In some embodiments, the injection-locked oscillator may oscillate at a sub-harmonic of the desired output frequency.

In some embodiments, each sub-ring stage can include a first chain of delay elements and a second chain of delay elements. Each delay element in the first chain of delay elements can receive an injection signal from a set of injection signals. The last delay element in the first chain of delay elements can be coupled to the first delay element in the second chain of delay elements. The output from the last delay element in the second chain of delay elements in a sub-ring stage can be inverted and coupled to the first delay element in the first chain of delay elements in the next stage.

Each sub-ring stage can further include a multiplexer/blender. The output of each delay element in the second chain of delay elements can be provided as an input to the multiplexer/blender. The output from the multiplexer/blender in each sub-ring stage can be provided as inputs to a main multiplexer, and the output of the main multiplexer can be provided as the output of the injection-locked oscillator.

The multiplexer/blender in each sub-ring stage can be used to adjust the number of delay elements that a signal passes through before being provided as an input to the main multiplexer. Specifically, a select signal can be provided to each multiplexer/blender in each sub-ring stage to select a desired number of delay elements.

In some embodiments, one or more pulses can be circulating in the injection-locked oscillator at any given time. As a pulse travels through a sub-ring stage, the multiplexers/blenders in that sub-ring stage can be used to adjust the width of the pulse. The adjusted pulse can then be outputted through the main multiplexer. Specifically, the main multiplexer can output a sequence of pulses (with any width adjustments) as the one or more pulses travel around the injection-locked oscillator by selecting the output from each of the multiplexers/blenders in a round-robin fashion. Note that the output frequency of the injection-locked oscillator does not change if the net adjustment in the pulse widths is equal to zero. In some embodiments, the output from the main multiplexer can be inputted into a counter, whose output can be inputted into a decoder, and the output of the decoder can be supplied as the select signal to the main multiplexer.

Injection-locked oscillator 800 can include multiple sub-ring stages, such as, sub-ring stages 818-1, 818-2, 818-3, and 818-4. In some embodiments, the sub-ring stages can be configured so that the injection-locked oscillator loop inverts the signal. This can be accomplished by performing an odd number of inversions in the injection-locked oscillator loop, e.g., by inverting the output signal from sub-ring stage 818-4 and providing the inverted signal as an input to sub-ring stage 818-1.

In some embodiments, each sub-ring stage can include two chains of delay elements and a multiplexer/blender. Specifically, sub-ring stage 818-1 can include first chain of delay elements 802-1, second chain of delay elements 804-1, and multiplexer/blender 814-1. Each delay element in first chain of delay elements 802-1 can receive a corresponding injection signal from the set of injection signals 808. Sub-ring stage 818-2 can include first chain of delay elements 802-2, second chain of delay elements 804-2, and multiplexer/blender 814-2. Each delay element in first chain of delay elements 802-2 can optionally receive a corresponding injection signal (shown using a dashed line) from the set of injection signals 808. Sub-ring stage 818-3 can include first chain of delay elements 802-3, second chain of delay elements 804-3, and multiplexer/blender 814-3. Each delay element in first chain of delay elements 802-3 can optionally receive a corresponding injection signal (shown using a dashed line) from the set of injection signals 808. Sub-ring stage 818-4 can include first chain of delay elements 802-4, second chain of delay elements 804-4, and multiplexer/blender 814-4. Each delay element in first chain of delay elements 802-4 can optionally receive a corresponding injection signal (shown using a dashed line) from the set of injection signals 808.

The last delay element in first chain of delay elements 802-1 can be coupled to the first delay element in second chain of delay elements 804-1.

Similarly, the last delay element in first chain of delay elements 802-2 can be coupled to the first delay element in second chain of delay elements 804-2, the last delay element in first chain of delay elements 802-3 can be coupled to the first delay element in second chain of delay elements 804-3, and the last delay element in first chain of delay elements 802-4 can be coupled to the first delay element in second chain of delay elements 804-4.

The outputs from the delay elements in second chain of delay elements 804-1 can be provided as inputs to multiplexer/blender 814-1. Similarly, the outputs from the delay elements in second chain of delay elements 804-2 can be provided as inputs to multiplexer/blender 814-2, the outputs from the delay elements in second chain of delay elements 804-3 can be provided as inputs to multiplexer/blender 814-3, and the outputs from the delay elements in second chain of delay elements 804-4 can be provided as inputs to multiplexer/blender 814-4.

The outputs (and optionally inverted versions of the outputs) of multiplexers/blenders 814-1, 814-2, 814-3, and 814-4 can be provided as inputs to main multiplexer 810, and the output of main multiplexer 810 can be outputted as output signal 806 of injection-locked oscillator 800.

Multiplexers/blenders 814-1, 814-2, 814-3, and 814-4 can be used to adjust the number of delay elements that an edge passes through before it is inputted into main multiplexer 810, or to blend or interpolate between intermediate settings between two delay-element phases. Using a blender can enable a finer precision in path length to be obtained.

In some embodiments, as an edge travels through each sub-ring stage, multiplexers/blenders 814-1, 814-2, 814-3, and 814-4 can be used to adjust the timing of the edge, thereby adjusting the width of the individual pulses. The width-adjusted pulses can then be outputted through main multiplexer 810. Specifically, main multiplexer 810 can output pulses (with any width adjustments) as the one or more pulses travel around injection-locked oscillator 800 by selecting the output from multiplexers/blenders 814-1, 814-2, 814-3, and 814-4 in a round-robin fashion. Note that the output frequency of injection-locked oscillator 800 does not change if the net adjustment in the pulse widths is equal to zero. This can be accomplished by having complementary delay settings on each of the sub-ring stages 818-1, 818-2, 818-3, and 818-4. In some embodiments, output signal 806 from main multiplexer 810 can be inputted into counter 816, the output of counter 816 can be inputted into decoder 820, and the output of decoder 820 can be supplied as select signal 812 to main multiplexer 810.

Figure 8B:
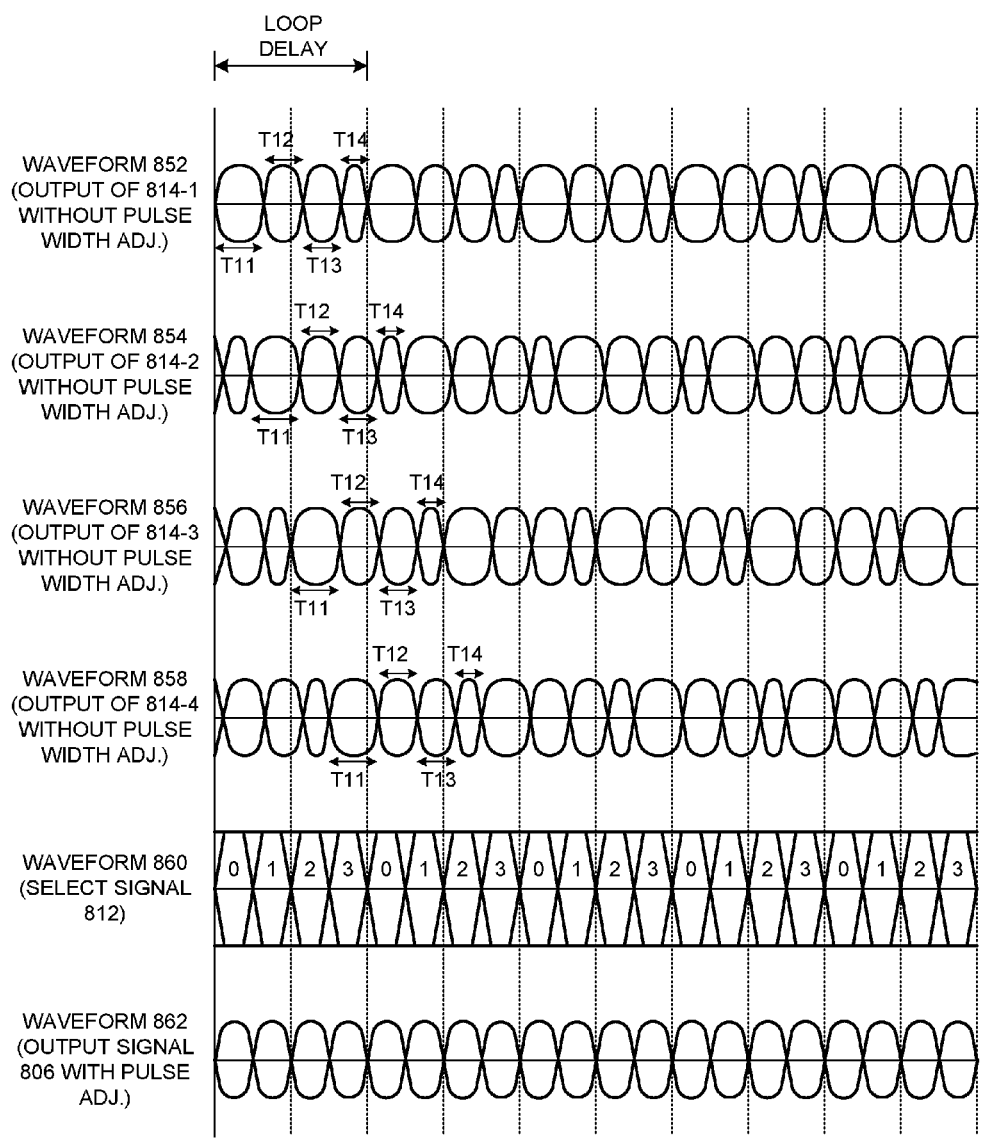
FIG. 8B illustrates waveforms associated with an unwrapped adjustable loop-length oscillator in accordance with some embodiments described in this disclosure.

FIG. 8B illustrates waveforms associated with an unwrapped adjustable loop-length oscillator with four sub-ring stages in accordance with some embodiments described in this disclosure. For example, the waveforms illustrated in FIG. 8B can correspond to an embodiment of ILO 800 shown in FIG. 8B that has four sub-ring stages. The differential signal waveforms shown in FIG. 8B are for illustration purposes only, and are not intended to limit the scope of the described embodiments.

Waveforms 852, 854, 856, and 858 can correspond to the outputs of multiplexers/blenders 814-1, 814-2, 814-3, and 814-4, respectively, when the sub-ring stages do not perform any pulse width adjustments. Since the pulse widths have not been adjusted, the multiplexer output signals may have deterministic jitter, as shown in waveform 852. Specifically, the deterministic jitter may include a repeating pattern of four pulses whose widths are T11, T12, T13, and T14. Pulse width T11 corresponds to the widest pulse, pulse width T12 and T13 correspond to medium width pulses, and pulse width T14 corresponds to the narrowest pulse.

Waveforms 854, 856, and 858 represent delayed versions of waveform 852. Specifically, waveform 854 is a delayed version of waveform 852, wherein the delay is equal to one-fourth of the loop delay. Similarly, waveform 856 is a delayed version of waveform 854, and waveform 858 is a delayed version of waveform 856, wherein both delays are equal to one-fourth of the loop delay.

Waveform 860 can correspond to select signal 812. The numbers inside the pulses in waveform 860 can correspond to the input (or inverted versions of the input) that is selected by select signal 812. For example, values "0," "1," "2," and "3" may correspond to the outputs (or the inverted versions of the outputs) of multiplexers/blenders 814-1, 814-2, 814-3, and 814-4, respectively, being selected by main multiplexer 810. The shape of waveform 860 is for illustration purposes only; the actual shape of waveform 860 may depend on the selection circuitry of multiplexer 810. For example, in some embodiments, select signal 812 may be supplied using a 3-bit data bus that carries a 3-bit value that corresponds to one of the eight inputs of main multiplexer 810. Waveform 862 can correspond to output signal 806 when the sub-ring stages perform width adjustment. As shown in FIG. 8B, waveform 862 has substantially less jitter than waveforms 852-858.

Figure 9:
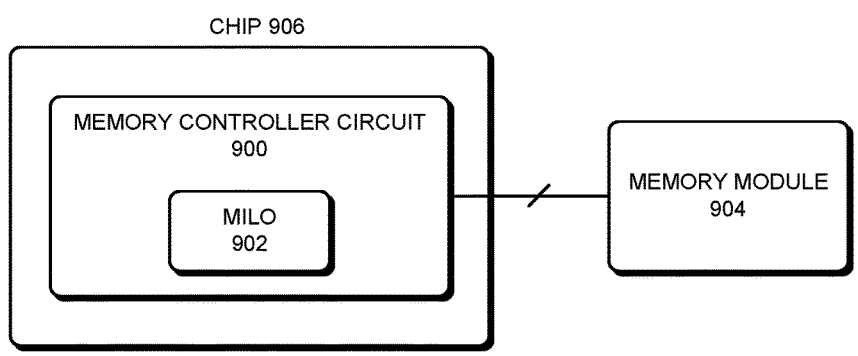
FIG. 9 illustrates a memory controller that includes a MILO in accordance with some embodiments described in this disclosure.

FIG. 9 illustrates memory controller circuitry that includes a MILO in accordance with some embodiments described in this disclosure.

Memory controller circuit 900 can be included in any integrated circuit that communicates with memory devices and/or memory modules. For example, memory controller circuit 900 can be included in chip 906 which can be a memory controller chip, a single core or multi-core processor, a graphics processing unit (GPU), and/or a system on a chip (SoC). Memory controller circuit 900 may be coupled with memory devices and/or memory modules (e.g., memory module 904) via one or more signal lines, which may carry control signals, clock signals, and/or data signals. Memory controller circuit 900 may include one or more MILOs, such as MILO 902. In some embodiments, memory controller circuit 900 may use MILO 902 to generate a clock signal that is used for communicating between memory controller circuit 900 and memory module 904 and/or memory devices disposed on memory module 904. FIG. 9 is for illustration purposes only, and is not intended to limit the scope of the disclosed embodiments.

Any data structures and/or code described in this disclosure can be stored on a computer-readable storage medium, which may be any device or medium now known or later developed that can store code and/or data for use by a computing system. Examples of a computer-readable storage medium include, but are not limited to, volatile memory, non-volatile memory, magnetic and optical storage devices such as disk drives, magnetic tapes, CDs (compact discs), and DVDs (digital versatile discs or digital video discs).

The methods and/or processes described in this disclosure can be embodied as code and/or data, which can be stored in a computer-readable storage medium as described above. The methods and/or processes may be performed when the code and/or data stored on the computer-readable storage medium is executed.

The methods and/or processes described in this disclosure can also be embodied in hardware. Hardware embodiments include, but are not limited to, application-specific integrated circuit (ASIC) chips, field-programmable gate arrays (FPGAs), and other programmable-logic devices now known or later developed.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. A circuit, comprising:
   a pulse-generator-and-injector (PGAI) circuit having a PGAI input to receive a reference clock signal and a set of PGAI outputs to output a set of injection signals, wherein each injection signal in the set of injection signals is a delayed version of a sequence of pulses;
   a set of injection-locked oscillators (ILOs) having a set of injection inputs and a set of ILO outputs, wherein each injection input in the set of injection inputs is coupled to a respective PGAI output in the set of PGAI outputs; and
   a multiplexer/blender (MUX/B) having a set of MUX/B inputs, a MUX/B output, and a MUX/B select input, wherein each ILO output in the set of ILO outputs is coupled with a respective MUX/B input in the set of MUX/B inputs, and wherein a PGAI output is coupled with the MUX/B select input.

2. The circuit of claim 1, wherein the PGAI circuit comprises a pulse generator (PG) circuit to generate the sequence of pulses.

3. The circuit of claim 2, wherein the PGAI circuit comprises a chain of delay elements to generate multiple delayed versions of the sequence of pulses.

4. The circuit of claim 2, wherein the sequence of pulses includes return-to-null pulses.

5. The circuit of claim 2, wherein the PG circuit comprises:
   a first PG circuit to generate a first sequence of pulses based on a reference signal; and
   a second PG circuit to generate the sequence of pulses based on the first sequence of pulses.

6. The circuit of claim 1, wherein the set of ILOs includes a single ILO.

7. The circuit of claim 1, wherein the set of ILOs includes multiple ILOs configured in a sequence so that outputs of a given ILO in the sequence are provided as injection signals to a next ILO in the sequence.

8. A memory controller circuit that controls an operation of a memory device, comprising:
   a pulse-generator-and-injector (PGAI) circuit having a PGAI input to receive a reference clock signal and a set of PGAI outputs to output a set of injection signals, wherein each injection signal in the set of injection signals is a delayed version of a sequence of pulses;
   a set of injection-locked oscillators (ILOs) having a set of injection inputs and a set of ILO outputs, wherein each injection input in the set of injection inputs is coupled to a respective PGAI output in the set of PGAI outputs;
   a multiplexer/blender (MUX/B) having a set of MUX/B inputs, a MUX/B output, and a MUX/B select input, wherein each ILO output in the set of ILO outputs is coupled with a respective MUX/B input in the set of MUX/B inputs, and wherein a PGAI output is coupled with the MUX/B select input; and an output pin, coupled to the MUX/B output, to provide a clock signal to the memory device.

9. The memory controller circuit of claim 8, wherein the PGAI circuit comprises a pulse generator (PG) circuit to generate the sequence of pulses.

10. The memory controller circuit of claim 9, wherein the PGAI circuit comprises a chain of delay elements to generate multiple delayed versions of the sequence of pulses.

11. The memory controller circuit of claim 9, wherein the sequence of pulses includes return-to-null pulses.

12. The memory controller circuit of claim 9, wherein the PG circuit comprises:
a first PG circuit to generate a first sequence of pulses based on a reference signal; and
a second PG circuit to generate the sequence of pulses based on the first sequence of pulses.

13. The memory controller circuit of claim 8, wherein the set of ILOs includes a single ILO.

14. The memory controller circuit of claim 8, wherein the set of ILOs includes multiple ILOs configured in a sequence so that outputs of a given ILO in the sequence are provided as injection signals to a next ILO in the sequence.

15. A memory system, comprising:
a memory circuit having a memory clock input; and
a memory controller circuit that controls an operation of the memory circuit, comprising:
a pulse-generator-and-injector (PGAI) circuit having a PGAI input to receive a reference clock signal and a set of PGAI outputs to output a set of injection signals, wherein each injection signal in the set of injection signals is a delayed version of a sequence of pulses;
a set of injection-locked oscillators (ILOs) having a set of injection inputs and a set of ILO outputs, wherein each injection input in the set of injection inputs is coupled to a respective PGAI output in the set of PGAI outputs; and
a multiplexer/blender (MUX/B) having a set of MUX/B inputs, a MUX/B output, and a MUX/B select input, wherein each ILO output in the set of ILO outputs is coupled with a respective MUX/B input in the set of MUX/B inputs, wherein a PGAI output is coupled with the MUX/B select input, and wherein the MUX/B output is coupled with the memory clock input.

16. The memory system of claim 15, wherein the PGAI circuit comprises:
a pulse generator (PG) circuit to generate the sequence of pulses; and
a chain of delay elements to generate multiple delayed versions of the sequence of pulses.

17. The memory system of claim 16, wherein the sequence of pulses includes return-to-null pulses.

18. The memory system of claim 16, wherein the PG circuit comprises:
a first PG circuit to generate a first sequence of pulses based on a reference signal; and
a second PG circuit to generate the sequence of pulses based on the first sequence of pulses.

19. The memory system of claim 15, wherein the set of ILOs includes a single ILO.

20. The memory system of claim 15, wherein the set of ILOs includes multiple ILOs configured in a sequence so that outputs of a given ILO in the sequence are provided as injection signals to a next ILO in the sequence.

\* \* \* \* \*